United States Patent
Kishimoto et al.

(10) Patent No.: US 8,230,891 B2
(45) Date of Patent: Jul. 31, 2012

(54) MANUFACTURING METHOD OF BOARDS, MOLD-RELEASING SHEET, MANUFACTURING APPARATUS FOR BOARD

(75) Inventors: Kunio Kishimoto, Osaka (JP); Toshiaki Takenaka, Kyoto (JP); Yukihiro Hiraishi, Hyogo (JP)

(73) Assignee: Panasonic Corporation, Osaka (JP)

( * ) Notice: Subject to any disclaimer, the term of this patent is extended or adjusted under 35 U.S.C. 154(b) by 225 days.

(21) Appl. No.: 12/471,850

(22) Filed: May 26, 2009

(65) Prior Publication Data

US 2009/0229762 A1    Sep. 17, 2009

Related U.S. Application Data

(62) Division of application No. 10/509,754, filed as application No. PCT/JP2004/000353 on Jan. 19, 2004, now abandoned.

(30) Foreign Application Priority Data

| Jan. 17, 2003 | (JP) | 2003-009445 |
| Jan. 17, 2003 | (JP) | 2003-009446 |
| Jan. 17, 2003 | (JP) | 2003-009447 |
| Jan. 17, 2003 | (JP) | 2003-009448 |

(51) Int. Cl.
*B32B 37/00* (2006.01)

(52) U.S. Cl. ..... 156/494; 156/537; 156/543; 156/580.1; 156/583.1

(58) Field of Classification Search ............ 156/537, 156/580, 581
See application file for complete search history.

(56) References Cited

U.S. PATENT DOCUMENTS

| 3,574,040 | A | * | 4/1971  | Chitwood et al. | 156/522 |
| 3,936,575 | A |   | 2/1976  | Watanabe et al. |         |
| 3,988,195 | A | * | 10/1976 | Henderson       | 156/514 |
| 4,117,198 | A |   | 9/1978  | Power et al.    |         |
| 4,328,061 | A | * | 5/1982  | Off et al.      | 156/353 |
| 4,357,395 | A |   | 11/1982 | Lifshin et al.  |         |
| 4,557,778 | A | * | 12/1985 | Held            | 156/209 |
| 4,909,886 | A |   | 3/1990  | Noguchi         |         |
| 4,994,133 | A |   | 2/1991  | Oizumi et al.   |         |
| 5,032,211 | A | * | 7/1991  | Shinno et al.   | 156/361 |

(Continued)

FOREIGN PATENT DOCUMENTS

JP    61-297172    12/1986

(Continued)

OTHER PUBLICATIONS

European Search Report issued in European Patent Application No. 04703242.0-1232, mailed Sep. 9, 2009.

(Continued)

*Primary Examiner* — James Sells
(74) *Attorney, Agent, or Firm* — McDermott Will & Emery LLP

(57) ABSTRACT

A highly reliable and productive manufacturing method of boards and a manufacturing apparatus are provided. The manufacturing apparatus includes heater-punches (4a) and (4b) disposed above and under pressuring holes (24) provided on positioning stage (6) which positions and laminates board materials. The apparatus also includes a supplying and discharging means of a mold-releasing sheet, and the means is formed of supply reel (22), take-up reel (23), and guide rolls (25a) and (25b). The sheet is supplied and discharged passing between heater-punches (4a) placed above pressuring holes (24) and heater-punches (4b) placed under pressuring holes (24).

5 Claims, 7 Drawing Sheets

U.S. PATENT DOCUMENTS

| | | |
|---|---|---|
| 5,043,041 A | 8/1991 | Sipos et al. |
| 5,482,586 A | 1/1996 | Fujikake et al. |
| 5,672,226 A | 9/1997 | Deardorf |
| 6,673,190 B2 | 1/2004 | Haas et al. |
| 7,017,265 B2 | 3/2006 | Tani et al. |
| 7,101,455 B1 * | 9/2006 | Hase et al. .................. 156/247 |
| 2002/0189088 A1 | 12/2002 | Kawashima et al. |

FOREIGN PATENT DOCUMENTS

| | | |
|---|---|---|
| JP | 62-212133 | 9/1987 |
| JP | 07-249868 | 9/1995 |
| JP | 07-283534 | 10/1995 |
| JP | 07288384 A | 10/1995 |
| JP | 11-074632 | 3/1999 |
| JP | 2000-022333 | 1/2000 |
| WO | WO 0132418 A1 * | 5/2001 |

OTHER PUBLICATIONS

European Search Report issued in European Patent Application No. 04 703 242.0-1232, mailed Mar. 1, 2011.

* cited by examiner

MANUFACTURING METHOD OF BOARDS, MOLD-RELEASING SHEET, MANUFACTURING APPARATUS FOR BOARD

RELATED APPLICATIONS

This application is a Divisional of U.S. application Ser. No. 10/509,754, filed Sep. 30, 2004 now abandoned, which is a U.S. National Phase under 35 U.S.C. §371 of International Application No. PCT/JP04/00353, filed Jan. 19, 2004, claiming priority of Japanese Application Nos. 2003-009445, filed Jan. 17, 2003; 2003-009446, filed Jan. 17, 2003; 2003-009447, filed Jan. 17, 2003; and 2003-009448, filed Jan. 17, 2003, the entire contents of each of which are hereby incorporated by reference.

TECHNICAL FIELD

The present invention relates to a method of manufacturing double-sided boards or multi-layer boards in which circuit-patterns in plural layers are coupled to each other, a mold-releasing sheet, a manufacturing apparatus of boards, and a method of manufacturing boards using the same mold-releasing sheet and the same manufacturing apparatus.

BACKGROUND ART

In recent years, electronic devices have been downsized and packed with components at a higher density. This trend accompanies a strong request to use multi-layer boards not only in the industrial electronic field but also in the consumer electronic field. A denser populated multi-layer board, among others, depends on a multi-layering accuracy of multi-layered circuit patterns about its performance because the circuit-patterns become formed of finer pitches. Thus a higher multi-layering accuracy as well as a more productive multi-layering method is demanded.

A conventional method of manufacturing multi-layer boards, in particular, four-layer boards is described hereinafter. First, a method of manufacturing double-sided boards (two-layer boards) that is a base of multi-layer boards is described.

FIGS. 5A-5F show sectional views of the conventional manufacturing method of double-sided boards. FIG. 5A shows aramid-epoxy sheet 51 (hereinafter referred to as prepreg) and via 52. Prepreg 51 is formed of composite in which thermosetting epoxy resin is impregnated into non-woven fabric, of which dimensions are 400 mm square and 150 μm deep, formed of aromatic polyamide fiber. Via 51 is formed by filling a through hole, which is processed by laser machining, with conductive paste by printing. The prepreg is a composite formed of base material, such as glass-cloth or paper, impregnated with resin before undergoing a drying process to become a semi-hardened state.

FIG. 5B shows copper foil 53a, heater-punches 54a, 54b of which tip is approx. 10 mm across, mold-releasing sheet 55 formed of fluoro-resin, and positioning stage 56. Positioning vias (not shown) prepared to prepreg 51 are positioned on copper 53a by using a recognition device (not shown) such as CCD, then prepreg 51 is laminated thereon. Given places of prepreg 51 are pressed and heated by, via mold-releasing sheet 55, heater-punches 54a and 54b heated up to approx. 300° C. and with a pressure of 0.1 Mpa for approx. 3 seconds, thereby melting the thermosetting epoxy resin of prepreg 51 for rigidly bonding prepreg 51 to copper foil 53a.

Next, as shown in FIG. 5C, the heat and press by heater-punches 54a, 54b are removed, then sheet 55 is peeled off. Reference mark 63 indicates recessed places pressed and heated by heater-punches 54a, 54b.

Then as shown in FIG. 5D, laminate copper foil 53b on prepreg 51 such that prepreg 51 is sandwiched by foils 53a and 53b. Press and heat given places on prepreg 51 and copper foil 53b by heater-punches 54a, 54b heated up to approx. 100° C. with a pressure of 0.7 Mpa for approx. 3 seconds, thereby rigidly bonding foil 53b onto prepreg 51. As a result, upper and lower copper foils 53a, 53b are bonded to prepreg 51. The second press is done at the given places different from those of the first ones, so that solid bonding between respective copper foils 53a, 53b and prepreg 51 is completed.

Next, as shown in FIG. 5E, set a hot-press (not shown) at 200° C. and with 5 Mpa and heat and press prepreg 51 for approx. 2 hours with this hot-press, thereby melting and hardening the thermosetting epoxy resin for bonding upper and lower copper foils 53a, 53b solidly onto prepreg 51. At the same time, cut off surplus copper foil on end face 51T, thereby completing a laminated sheet having two layers of copper-clad. Upper and lower copper foils 53a, 53b are electrically coupled to each other by vias 52 filled with conductive paste.

Next, as shown in FIG. 5F, remove selectively copper foils from given places on the surface of copper-clad laminated board 57 by etching, and form circuit patterns 58, thereby completing board 59.

FIGS. 6A-6F show sectional views illustrating steps of a conventional manufacturing method of multi-layer boards, e.g. four-layer boards among others. In FIG. 6A, copper foil 53a and prepreg 51a are placed on positioning stage 56 undergone the same steps described in FIGS. 5A-5F.

Then laminate board 59 as an inner layer core-board onto prepreg 51a. This lamination is done after a positioning pattern (not shown) formed on board 59 is positioned with positioning vias (not shown) prepared on prepreg 51a by a recognition device (not shown) such as CCD.

After the lamination, press and heat prepreg 51 at given places via mold-releasing sheet 55 by heater-punches 54a, 54b heated up to approx. 300° C. for approx. 3 seconds. As a result, copper foil 53a, prepreg 51a, and board 59 are rigidly bonded to each other.

Next, as shown in FIG. 6B, detect and recognize positioning vias (not shown) of prepreg 51b by a recognition device such as CCD, then prepreg 51b is positioned with the positioning pattern formed on board 59 already fixed onto stage 56. After the positioning, laminate prepreg 51b onto board 59.

Next, press and heat board 59 at given places via mold-releasing sheet 55 by heater-punches 54a, 54b heated up to approx. 300° C. for approx. 3 seconds, thereby rigidly bonding board 59 and prepreg 51b to each other.

Then as shown in FIG. 6C, laminate copper foil 53b onto prepreg 51b, and press and heat foil 53b at given places by heater-punches 54a, 54b heated up to 300° C. for 3 seconds. This press and heat bonds lower copper foil 53a, lower prepreg 51a, board 59, upper prepreg 51b, and upper copper foil 53b respectively to each other, and they are fixed to each other.

Next, as shown in FIG. 6D, set the hot-press (not shown) at 200° C. with 5 Mpa, and press and heat the entire laminated unit including board 59 for approx. 2 hours by the hot-press. This press and heat melts the thermosetting epoxy resin included in upper and lower prepregs 51a, 51b, thereby rigidly bonding upper and lower copper foils 53a, 53b, upper and lower prepreg 51a, 51b to each other with the thermosetting epoxy resin. As a result, four-layer and copper-clad board 60 is produced.

Further, as shown in FIG. 6E, remove selectively the copper foil from given places on the surface of four-layer copper-clad board 60 by etching, and form circuit patterns 61, thereby completing multi-layer board 62 having four layers.

If more layers are needed to multi-layer board 62, repeat the steps discussed above using four-layer board 62 shown in FIG. 6E as a core board.

Prior art including what is discussed above is disclosed, e.g. in Japanese Patent Application Non-Examined Publication No. H07-283534.

FIG. 7 shows a schematic diagram illustrating problems in the prior art. Mold-releasing sheet 55 is disposed between heater-punch 54 and prepreg 51. This placement allows pressing and heating prepreg 51 at given places free from dirtying or damaging heater-punch 54. This placement also allows the resin included in prepreg 51 to be completely hardened for bonding prepreg 51 to copper foils 53a, 53b. However, the given places pressed and heated are still kept at a high temperature, and thermosetting epoxy resin 62 included in prepreg 51 is still in a melting state. Since prepreg 51 is still welded with sheet 55, parts of resin 62 melted is attached to or absorbed by sheet 55 when sheet 55 is peeled off.

Sections 63 recessed due to the press and heat at a high temperature have less resin because the resin is melted to flow out, so that the core member of prepreg 51 is exposed. In other words, sections 63 are recessed due to the press and heat by heater-punch 54, and have little resin because the resin is melted at a high temperature and pressed, whereby the resin is pushed away.

The resin pushed away is attached to mold-releasing sheet 55, and removed, so that recessed sections 63 become short of resin. The resin still remained there has been hardened almost completely, so that uniform thickness in resin cannot be expected even if some resin flows in from the vicinity in an onward step using a hot-press. Therefore, recessed sections 63 are left in a porous state, so that etching solution tends to enter into recessed sections 63.

In other words, according to the conventional manufacturing method, prepreg 51 is pressed and heated at a high temperature when prepreg 51 is laminated and rigidly bonded onto the copper foil or a core board, so that the resin at the pressed section flows out and is completely hardened. As a result, the core member of prepreg 51 is exposed and left in a porous state. The users have been obliged to accept this inconvenience.

If undesirable porous sections occur on prepreg 51, etching solution enters into those sections when circuit patterns are formed, and residue of the etching solution adversely influences the remaining manufacturing steps. The users also have been obliged to accept this inconvenience. In other words, the conventional manufacturing method has a problem that the residue of etching solution causes pollution to the steps onward.

In the conventional lamination step, mold releasing sheet 55 and prepreg 51 solidly attached to sheet 55 pull each other, so that the materials laminated slide from each other.

The present invention provides a method of manufacturing substrates, which method hardens the prepreg resin incompletely at the lamination and is excellent in accuracy as well as productivity. The present invention also provides a mold-releasing sheet and an apparatus for manufacturing boards, and a method of manufacturing boards using the same mold-releasing sheet and the same manufacturing apparatus.

DISCLOSURE OF THE INVENTION

A method of manufacturing boards of the present invention includes laminating a prepreg as a lamination layer. This laminating of the prepreg comprises:

heating and pressing the prepreg at given places by a heating means via a mold releasing sheet;

removing the pressing and heating;

cooling the prepreg; and peeling off the mold releasing sheet.

The foregoing manufacturing method allows placing the prepreg over a metal foil or a board, or the prepreg over a preprag, and fixing the placed-over unit at given places, so that double sides boards or multi-layer boards are laminated each other accurately.

Another method of manufacturing boards of the present invention comprises:

laminating a prepreg on a metal foil;

heating and pressing the prepreg at given places for fixing the prepreg to the metal foil;

laminating a board, which includes a circuit pattern, on the prepreg;

heating and pressing the board at given places for fixing the board to the prepreg;

laminating another prepreg on the board;

heating and pressing the another prepreg at given places for fixing the another prepreg to the board;

laminating another metal foil thereon;

heating and pressing the another metal foil at given places for fixing the another metal foil to the another prepreg; and heating and pressing the foregoing entire pressed and heated unit.

A method of heating and pressing the prepreg at the given places includes:

heating and pressing the prepreg at the given places by a heat and press means via a mold releasing sheet;

removing the heating and pressing of the heat and press means; and peeling off the mold releasing sheet after the prepreg is cooled.

According to the manufacturing method of the present invention, the given places of the prepreg is heated and pressed by a heated heater-punch via a mold releasing sheet. As a result, the resin in stage-B impregnated into the prepreg is softened or melted to be used as adhesive for rigidly bonding structural elements to each other. The stage-B indicates that when a material is brought into contact with liquid such as alcohol or acetone, the material swells but not completely dissolves into the liquid, namely, the material is tentatively hardened.

The manufacturing method of the present invention proceeds the process such as completing the heat and press, then removing the heat and press, and peeling the mold releasing sheet off the prepreg after the prepreg is cooled. This procedure advantageously allows laminating multi-layer boards accurately.

In the manufacturing method of the present invention, a board having circuit patterns is composite formed of woven fabric or non-woven fabric and thermosetting resin. This structure improves mechanical strength of the board. Also in this method, the prepreg is impregnated with resin into its base material, and yet, it is kept in stage-B. This structure prevents, e.g. thermosetting epoxy resin from being pushed out and flowing out due to the pressure.

The mold releasing sheet of the present invention is disposed between the prepreg and the heat and press means when the prepreg is heated and pressed, and has both of heat resisting properties and mold release properties. The mold releasing sheet is made from fluoro resin, polyphenylene-sulfide or polyethylene resin both of the latter two materials undergone release-process. The foregoing sheet can resist the heat from the heater-punch, and eliminate the inconvenience of adhering to the prepreg.

A manufacturing apparatus of boards of the present invention comprises the following elements:
- a stage for positioning and laminating board materials;
- a pressuring hole provided to the stage for applying a pressure;
- a heating and pressing means movable up and down and disposed above and under the holes; and
- a supplying and discharging means (a mold-releasing sheet unit) of a mold-releasing sheet.

The mold-releasing sheet passes the place of pressuring hole, between the upper and lower heating and pressing means for being supplied or discharged.

Another manufacturing apparatus of the present invention has plural pressuring holes at given places of the stage. The plural holes, provided where the mold releasing sheet passes, can separate the pressure to be applied to the lower prepreg and to the upper prepreg.

Still another manufacturing apparatus of the present invention can change the tension of the mold releasing sheet rolled on a supply reel disposed at a first end of the stage and on a take-up reel disposed at a second end of the stage. This structure allows peeling off the mold-releasing sheet advantageously with ease after the lamination.

Yet another manufacturing apparatus of the present invention can adjust the tension applied to the mold releasing sheet supplied from the supply reel and taken up by the take-up reel. This structure allows adjusting a loose amount of the sheet so that tension is not yet applied to the sheet after the supplying and discharging means (the mold-releasing sheet unit) rises.

Still another manufacturing apparatus of the present invention includes plural guide-rollers between the supply reel and the take-up reel for guiding the mold-releasing sheet. This structure allows positioning the sheet and bonding at plural places at one time.

Further another manufacturing apparatus of the present invention has the supplying and discharging means (the mold-releasing sheet unit) movable up and down. This structure allows placing and peeling off the mold-releasing sheet efficiently, and supplying the boards steadily and at a high productivity.

Still further another manufacturing apparatus of the present invention includes pressuring holes of which diameters are greater than that of the heat and press means, and the heat and press means is movable horizontally. This structure allows avoiding pressing the prepreg at the same place plural times, so that the boards of equal quality can be obtained.

Still another manufacturing apparatus of the present invention uses the heating means, which heats and presses the mold-releasing sheet at given places, as a heater which always heats the sheet, so that an inexpensive heating means is obtainable.

Another manufacturing apparatus of the present invention employs a pulse heater or a supersonic-wave generator to the heating means which heats and presses the mold-releasing sheet partially. This structure allows cooling the sheet heated quickly.

The present invention provides a method of manufacturing boards with the foregoing manufacturing apparatus. The method comprising:
- positioning and laminating board materials on the stage;
- placing the mold-releasing sheet supplied from the supplying and discharging means of the sheet onto the board materials;
- heating and pressing the board materials via the mold-releasing sheet by the heat and press means;
- removing the heat and press applied to the board materials by the heat and press means;
- cooling the board materials;
- peeling the mold-releasing sheet off the board materials; and
- discharging the mold-releasing sheet.

This manufacturing method produces double-sided boars or multi-layer boards.

The manufacturing method using the manufacturing apparatus allows taking up the mold-releasing sheet only from one side after the prepreg is cooled down to its softening point, and at the same time, the sheet is sequentially and gradually peeled off the one side toward another side. As a result, the sheet can be peeled off smooth. The boards can be thus supplied steadily at a high productivity by the manufacturing method using the manufacturing apparatus which efficiently manufactures the boards.

PREFERRED EMBODIMENTS OF THE INVENTION

Exemplary embodiments of the present invention are demonstrated hereinafter with reference to the accompanying drawings.

Exemplary Embodiment 1

FIG. 1A-FIG. 1G show sectional views illustrating steps of manufacturing double-sided boards (two layers) which are to be inside core boards of multi-layer boards in accordance with the first exemplary embodiment of the present invention.

Figure 1A:
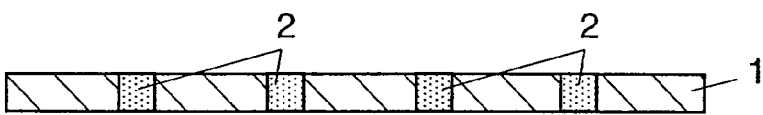
FIG. 1A-FIG. 1G show sectional views illustrating a manufacturing method of boards in accordance with an exemplary embodiment of the present invention.

FIG. 1A shows aramid-epoxy sheet (hereinafter referred to as prepreg) 1 formed of composite in which aromatic polyamide non-woven fiber, of which dimensions are 400 mm square and 150 μm thick, is impregnated with thermosetting epoxy resin, and via 2 filled with conductive paste by printing. Via 2 is a through hole processed by laser beam.

Figure 1B:
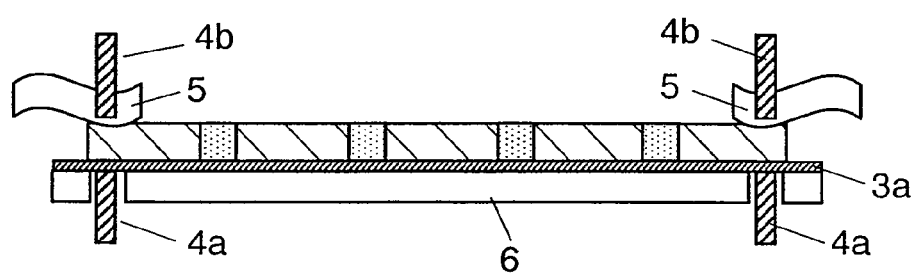

FIG. 1B shows copper foil 3a situated on positioning stage 6, heater-punches 4a, 4b having a tip of approx. 10 mm across and working as a heating means, and mold-releasing sheet 5. The releasing properties of sheet 5 are increased by applying silicon to polypheneylene-sulfide of 75 μm thick. When sheet 5 is solidly pressed onto prepreg 1, the side undergone the release-process is brought into contact with prepreg 1.

Place prepreg 1 on copper foil 3*a* situated on stage 6 by using a recognition device such as CCD to recognize a positioning via (not shown) for laminating prepreg 1 on copper foil 3*a*. Then heat prepreg 1 at given places for approx. 3 seconds by heater-punches 4*a*, 4*b* heated up to approx. 100° C. with a pressure of 0.1 Mpa. This heat and press soften or melt the thermosetting epoxy resin, so that prepreg 1 and copper foil 3*a* are bonded together.

Figure 1C:
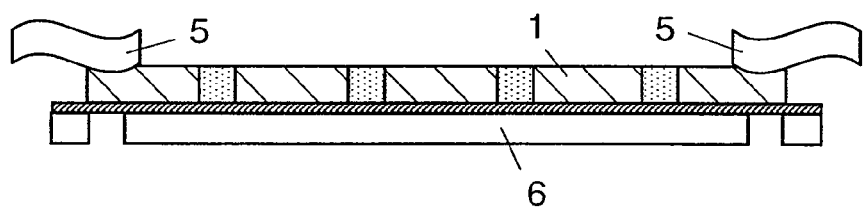

Next, as shown in FIG. 1C, remove the heat and press applied by heater punches 4*a*, 4*b*, then situate mold-releasing sheet 5 on prepreg 1. At this time, since sheet 5 has been heated and pressed up to a temperature slightly higher than the softening point of prepreg 1, the thermosetting epoxy resin impregnated into prepreg 1 is not pushed out or hardened although it is pressed, but kept in stage-B status.

Figure 1D:
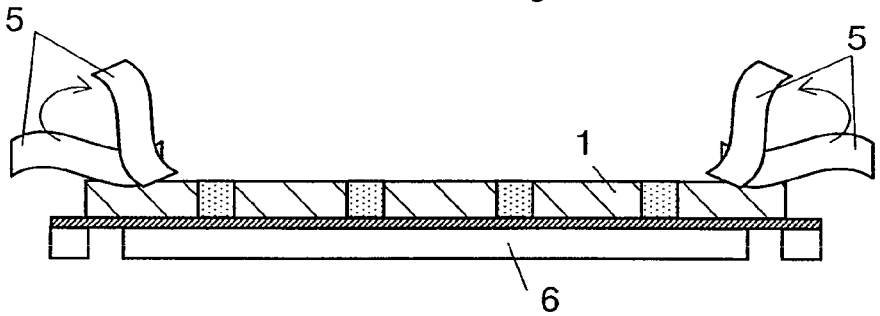

Next, as shown in FIG. 1D, peel sheet 5 off at its one side gradually and sequentially after the heated and pressed section of prepreg 1 lowers its temperature. Sheet 5 can be peeled off prepreg 1 lightly, to be more specific, a temperature lower than the softening point of the thermosetting epoxy resin facilitates sheet 5 to be peeled off more lightly.

Mold-releasing sheet 5 is formed by applying epoxy resin onto the surface of polyethylene resin and hardening it for improving heat resistance as well as release properties. Use of fluoro-resin instead of the foregoing material will produce a similar advantage.

Figure 1E:
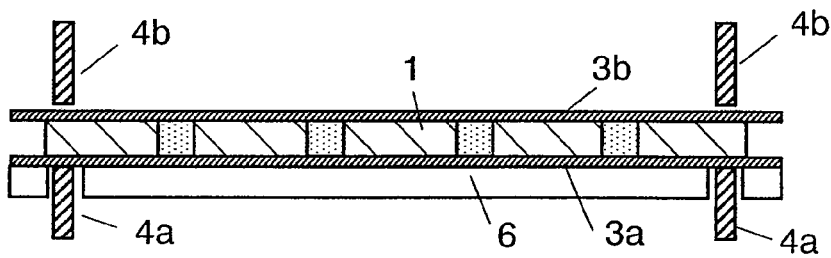

Next, as shown in FIG. 1E, laminate copper foil 3*b* on prepreg 1, then heat and press prepreg 1 at given places with pressure of 0.1 Mpa for approx. 3 seconds by heater punches 4*a*, 4*b* heated up to approx. 100° C., thereby rigidly bonding copper foils 3*a*, 3*b* and prepreg 1 together.

Figure 1F:
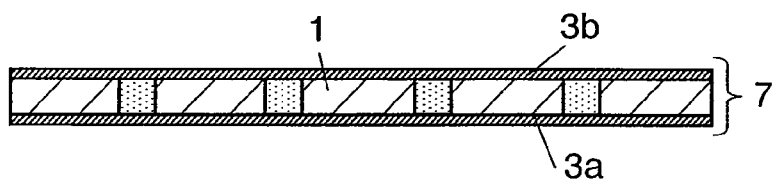

Next, as shown in FIG. 1F, heat and press the entire face of prepreg 1 by a hot press (not shown) up to 200° C. with pressure of 5 Mpa for approx. 2 hours. The step of heat and press melts and hardens the thermosetting epoxy resin impregnated in prepreg 1, and the melted and hardened resin bonds upper and lower copper foils 3*a*, 3*b* to prepreg 1. Surplus copper foils at the ends of prepreg 1 are cut, so that two-layer copper-clad laminated board 7 is produced. The step of heat and press electrically couples upper and lower copper foils 3*a* and 3*b* because of via 2 provided to prepreg 1 and filled with conductive paste.

Figure 1G:
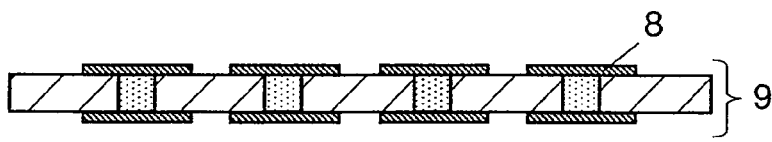

Then as shown in FIG. 1G, remove the copper foil selectively from laminated board 7 by etching, thereby completing two-layer board 9 having circuit pattern 8. At this time, the sections of prepreg 1 heated and pressed by heater-punches 4*a*, 4*b* are in stage-B status; however, the core material of the board is not exposed because the resin becomes liquid status when prepreg 1 is pressed. Thus the etching solution does not soak into the circuit pattern, so that residue of the etching solution is kept down from being brought to the next step.

FIGS. 2A-2F show sectional view illustrating a method of manufacturing multi-layer boards in accordance with the present invention, these drawings show a board having four layers.

Figure 2A:
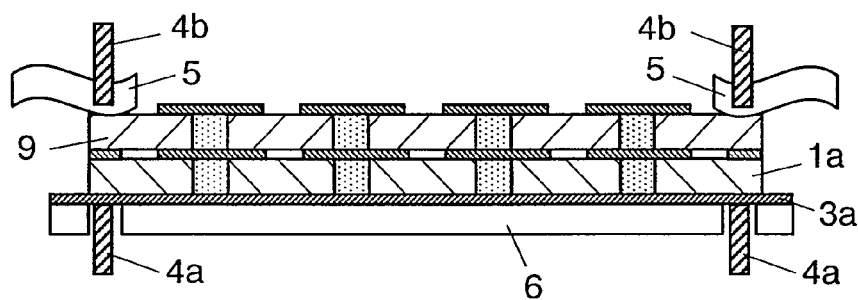
FIG. 2A-FIG. 2F show sectional views illustrating a manufacturing method of multi-layer boards in accordance with an exemplary embodiment of the present invention.

In FIG. 2A, copper foil 3*a* and prepreg 1*a* are placed on stage 6 after the same steps as shown in FIGS. 1A-1D are taken. Then laminate two-layer board 9 as an inner core board on prepreg 1*a*. This lamination is done after a positioning pattern (not shown) formed on board 9 and positioning via (not shown) formed on prepreg 1*a* are registered by using a recognition device (not shown) such as CCD. After the registration, heat and press prepreg 1*a* and board 9 at given places via mold-releasing sheet 5 by heater-punches 4*a*, 4*b* heated up to approx. 100° C. for approx. 3 seconds. Copper foil 3*a*, prepreg 1*a* and two-layer board 9 are thus bonded together.

In the foregoing heat and press step, mold-releasing sheet 5 is used, because direct press of the inner board by heater-punches 4*a*, 4*b* will contaminate the inner board, and the use of sheet 5 also prevents sheet 5 from welding to board 9. Sheet 5 can be thus peeled off immediately after the heat and press step free from any trouble.

Figure 2B:
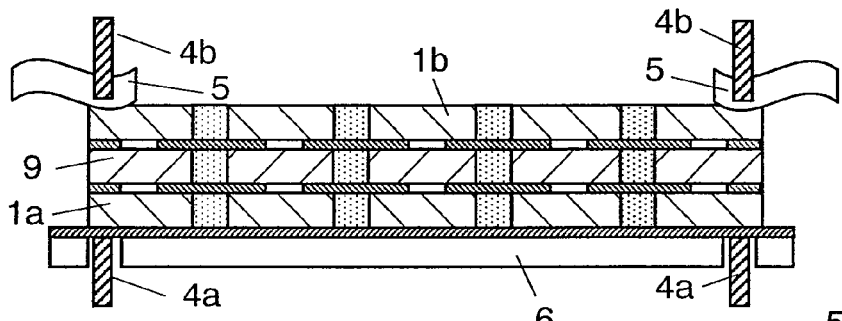

Next, as shown in FIG. 2B, the positioning pattern (not shown) on board 9 and a positioning via (not shown) formed on prepreg 1*b* are registered by using the recognition device (not shown) such as CCD, then prepreg 1*b* is laminated on board 9. After the registration, heat and press prepreg 1*b* at given places via mold-releasing sheet 5 by heater-punches 4*a*, 4*b* heated up to approx. 100° C. for approx. 3 seconds, so that board 9 and prepreg 1*b* are bonded together.

Figure 2C:
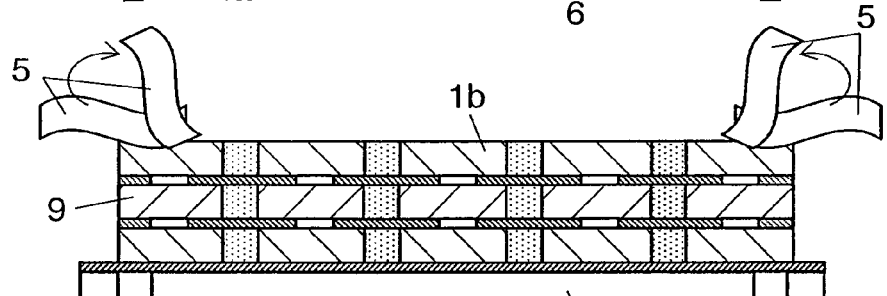

Next, as shown in FIG. 2C, after the heat and press by heater-punches 4*a* and 4*b*, wait until the heated section of prepreg 1*b* cools down, and peel off sheet 5 from one side sequentially and gradually, which can prevent the boards laminated from deviating from each other. A temperature lower than the softening point of the thermosetting epoxy resin impregnated into prepreg 1*b* facilitates peeling sheet 5, so that this lower temperature also prevents the boards from deviating from each other.

Figure 2D:
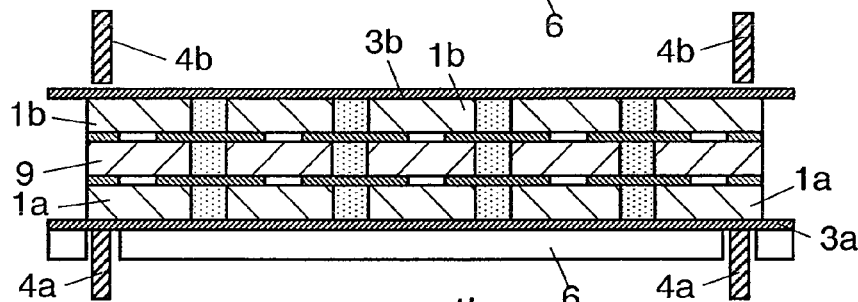

Next, as shown in FIG. 2D, laminate copper foil 3*b* on prepreg 1*b*, and heat and press copper foil 3*b* at given places by heater-punches heated up to approx. 100° C. for approx. 3 seconds. As a result, copper foil 3*a*, prepreg 1*a*, two-layer board 9, prepreg 1*b* and copper foil 3*b* are bonded together.

Figure 2E:
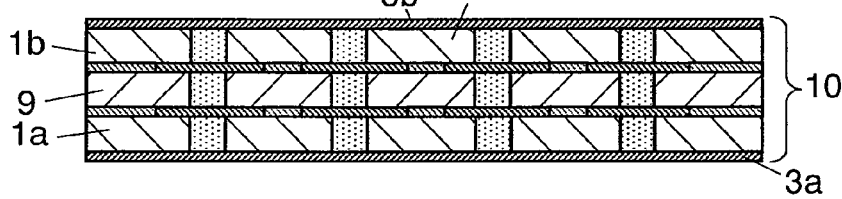

Next, as shown in FIG. 2E, set a hot-press (not shown) at 200° C. and 5 Mpa for heat and press, thereby melting thermosetting epoxy resin impregnated in upper prepreg 1*a* and lower prepreg 1*b*, then bond copper foils 3*a*, 3*b*, prepregs 1*a*, 1*b* and two-layer board 9 together with the thermosetting epoxy resin. Four-layer copper clad laminated board 10 is thus completed.

Figure 2F:
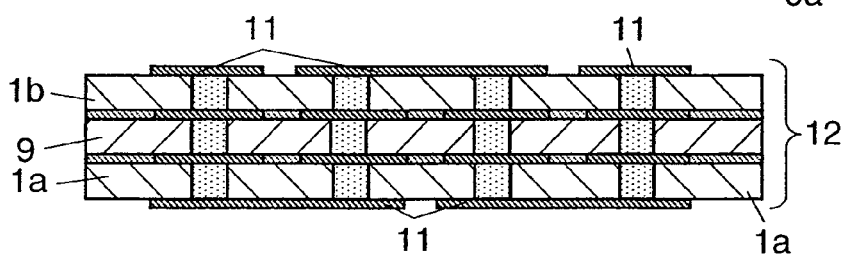

Further, as shown in FIG. 2F, remove selectively the copper foil on the surface of board 10 by etching for forming circuit pattern 11, so that multi-layer board 12 having 4 layers are produced.

Particular sections of board 12 heated and pressed by heater-punches 4*a*, 4*b* have been kept in stage-B status before the hot-press is applied, so that the hot-press turns the resin into liquid and the board surface is kept flat. The core material of board, i.e. aramid, is not exposed on the surface, so that board 12 is kept in good condition.

If a user wants to produce multi-layer board 12 having not less than 4 layers, the user can use an inner core board instead of two-layer board 9, and repeat the steps shown in FIGS. 2A-2E In this first embodiment, the steps of placing copper foils 3*a*, 3*b* on stage 6, then laminating prepreg, core board, prepreg, and copper foil sequentially in this order are described. However, the respective steps can be applied to another method, e.g. prepregs are placed on both sides of a core board, and the foregoing elements are bonded to both sides sequentially. There is still another laminating method: plural core boards and prepregs are piled up alternately so that the prepregs become the outer most layers.

In other words, the manufacturing method of the present invention produces a similar advantage in the following procedure: a mold-releasing sheet is disposed between the prepreg and the heater-punches, then the sheet is peeled off, and copper foils are put on the prepreg. Then the unit as a whole is heated by a hot-press to produce a multi-layer board.

In this embodiment, aramid-nonwoven fiber is used as a core material; however, woven fiber made from glass-epoxy can be used with a similar advantage.

The inventors direct their attention to the problem of the conventional manufacturing method, and study peeling properties of the mold-releasing sheet to find an appropriate peeling condition based on experiments.

This appropriate condition allows the heater-punch not to be set at a high temperature, so that the resin in the prepreg does not become liquid or flow out, and yet, the resin is not hardened. The problem, i.e. the resin attaches to the sheet when the mold-releasing sheet is peeled off, is thus overcome. The present invention also allows the prepreg not to be pulled by the sheet, so that deviation of laminated layers from each other does not occur, which increases the bonding strength.

Table 1 shows the comparison of peaks and valleys of board surfaces between the manufacturing method of the present invention and the conventional manufacturing method.

TABLE 1

|  | Mfg. method of the invention | conventional Mfg. method |
|---|---|---|
| before heat and press | Ra=2.1μm | Ra=2.2μm |
| solidly pressed section after heat and press | Ra=4.2μm | resin reservoir formed by heater-punch Ra=8.1μm |
| solidly pressed section after press | Ra=0.9μm | Ra=2.2μm |

According to both of the Mfg. Methods, core-material is exposed from both of the board surfaces, and have surface roughness Ra of approx. 2 μm respectively.

If the board in this condition is heated and pressed by the conventional method, the resin pushed out by the heater-punch forms a resin reservoir around the heater-punch, and the sections heated and pressed expose the core material of the prepreg to make surface roughness Ra=8.1λm. On the other hand, if the board is heated and pressed by the method of the present invention, the surface roughness becomes Ra=4.2 μm, and the resin is still in stage-B status.

The prepreg in the foregoing condition is heated and pressed by a hot-press. In the conventional method, since the resin is about to be hardened, the resin does not flow enough. The peaks and valleys already formed still exist, and surface roughness Ra=2.2 μm indicates that the core material of the prepreg is explicitly exposed.

On the other hand, in the method of the present invention, although the surface seems more or less rough after heat and press, the resin remains in stage-B status on the prepreg surface. Thus after the press, the surface becomes flat, i.e. roughness Ra=0.9 μm. As a result, residual of etching solution does not adversely influence the steps onward, and an active area to be used as a board is expanded, thereby improving the material efficiency. Although the conventional method needs a heating temperature as high as 300° C., the method of the present invention can heat at a rather lower temperature, so that the power of the heater-punch can be saved, and the service life of the heater-punch can be extended. As a result, quality and productivity of the boards are improved.

Exemplary Embodiment 2

Figure 3:
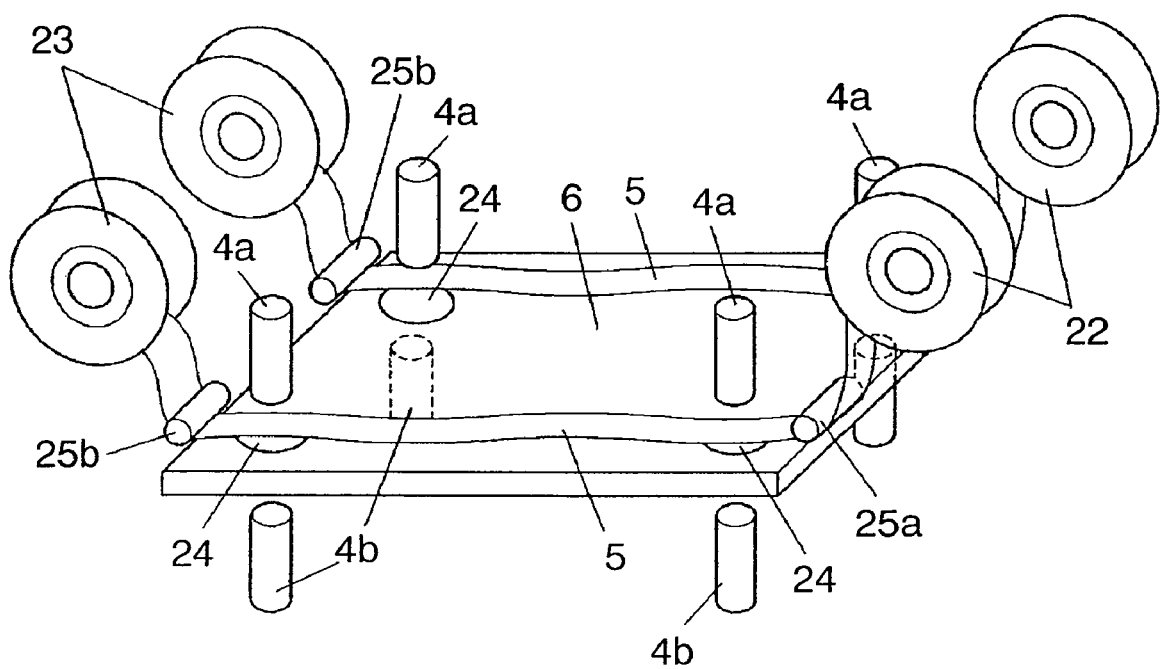
FIG. 3 shows a perspective view of a manufacturing apparatus of boards in accordance with an exemplary embodiment of the present invention.

FIG. 3 shows a perspective view of a manufacturing apparatus for manufacturing the boards of the present invention. FIG. 3 shows heater-punches 4a, 4b to be used as heating means, and positioning stage 6 having pressuring holes 24 at given places for pressing an underside of a board. Supply reels 22 are disposed at given places on one side of stage 6 for supplying mold-releasing sheet 5, and tape-like mold-releasing sheet 5 is wound on a plastic core, and this core is mounted to respective reels 22.

Sheet 5 supplied from reel 22 is guided by guide-roll 25a and fed onto stage 6, and travels through heater-punches 4a and 4b, which are disposed at given places on stage 6, such that sheet 5 divides the heater punches into upper section 4a and lower section 4b. Then sheet is guided by guide roll 25b and taken up by take-up reel 23.

Placement of sheet 5 as shown in FIG. 3, namely, placement of four pairs of heater-punches 4a and 4b, allows bonding at four places at one time. Additional pressuring holes 24 at given places, where sheet 5 travels, on stage 6 allows dividing the pressure to pressure applies to lower prepreg 1a and pressure applied to upper prepreg 1b (refer to FIG. 2F). This structure avoids pressing the prepreg at the same place plural times. In this case, heater-punches 4a, 4b can be added, or a greater hole diameter of pressuring hole 24 than that of heater-punches 4a, 4b allows moving by a slide-bearing or the like.

The manufacturing apparatus of the present invention manufactures the boards at a higher efficiency, and assures supplying the boards steadily and at a higher productivity.

Exemplary Embodiment 3

An operation of the manufacturing apparatus for the boards of the present invention is demonstrated with reference to FIGS. 4A-4E. In this demonstration, descriptions are particularly focused to the following two steps: solidly pressing prepreg 1 after prepreg 1 is laminated on copper foil 3a, and peeling-off mold-releasing sheet 5.

Figure 4A:
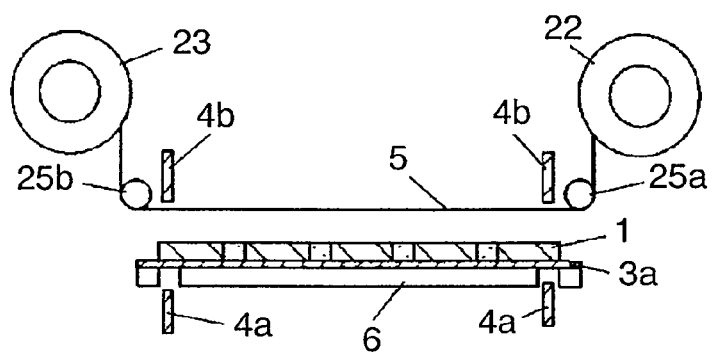
FIG. 4A-FIG. 4E show operations of a manufacturing apparatus in accordance with an exemplary embodiment of the present invention.

FIG. 4A shows prepreg 1 positioned and situated on copper 3a placed on positioning stage 6. Sheet 5 is disposed over prepreg 1, and supplied from supply reel 2. Sheet 5 is then guided by guide roll 25b and taken up by take-up reel 23. Both of supply reel 22 and take-up reel 23 have a tension adjusting function.

Figure 4B:
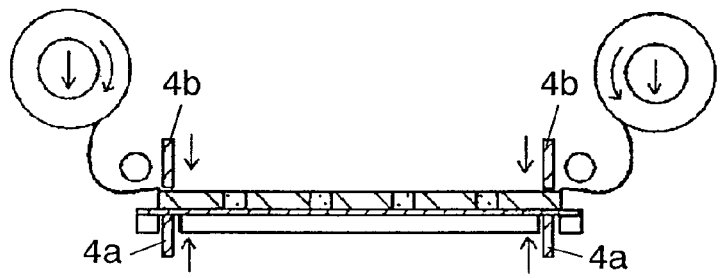

FIG. 4B shows the steps of heating and pressing by heater-punches 4a, 4b. Pressing heater-punches 4a, 4b prompts the following elements to lower almost at the same time: supply reel 22, guide rolls 25a, 25b, mold-releasing sheet 5, a supplying and discharging means (it is called a mold-releasing unit) of take-up reel 23. Tension between supply reel 22 and take-up reel 23 is released, and sheet 5 comes off guide rolls 25a, 25b. Copper foil 3 and prepreg 1 are solidly pressed onto this loose sheet 5. In FIG. 4B, sheet 5 loosens such that rise of the mold-releasing unit does not yet provide sheet 5 with tension.

Figure 4C:
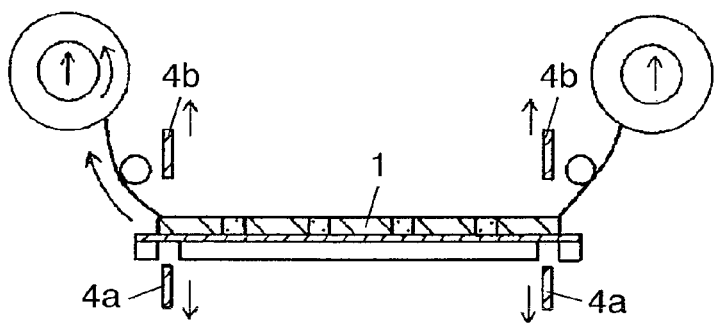

Next, as shown in FIG. 4C, when heater-punches 4a, 4b remove the pressure, the mold-releasing unit rises at the same time. At this time, since sheet 5 is loose, sheet 5 is kept bonded on prepreg 1.

Figure 4D:
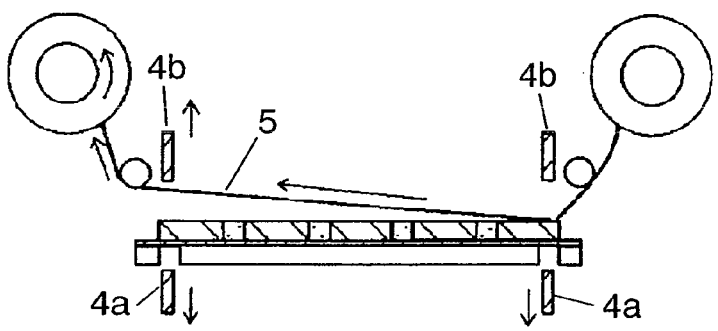
Figure 4E:
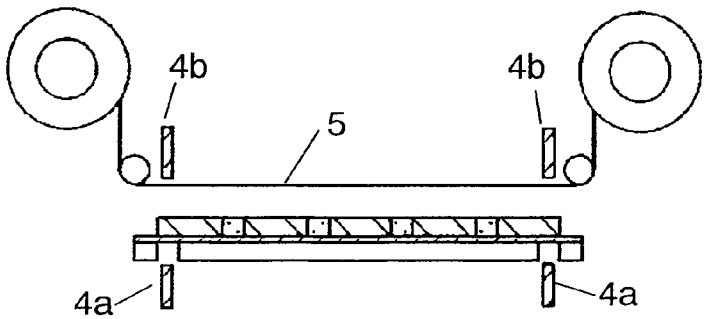
Figure 5A:
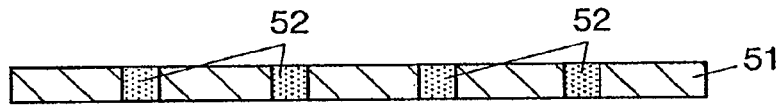
FIG. 5A-FIG. 5F show sectional views illustrating a conventional manufacturing method.
Figure 5B:
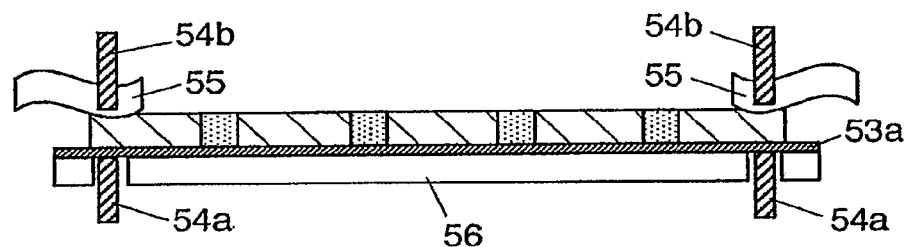
Figure 5C:
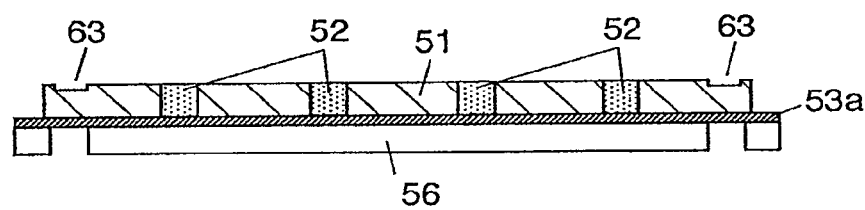
Figure 5D:
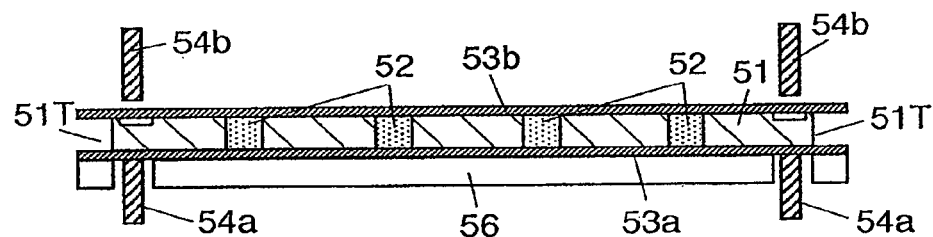
Figure 5E:
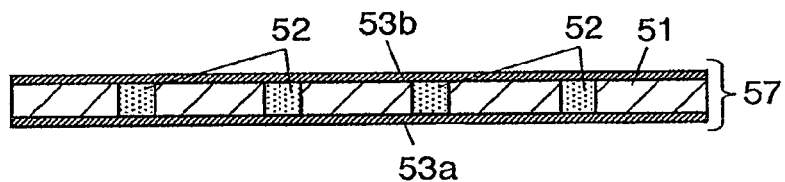
Figure 5F:
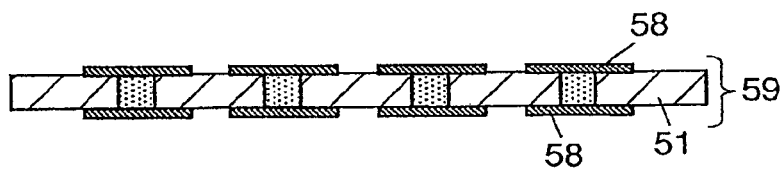
Figure 6A:
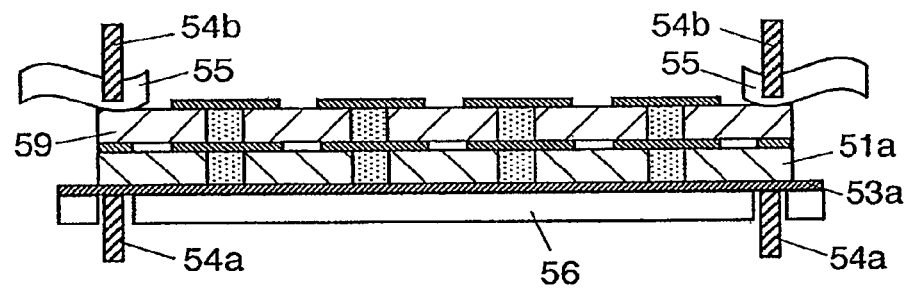
FIG. 6A-FIG. 6E show sectional views illustrating a conventional manufacturing method of multi-layer boards.
Figure 6B:
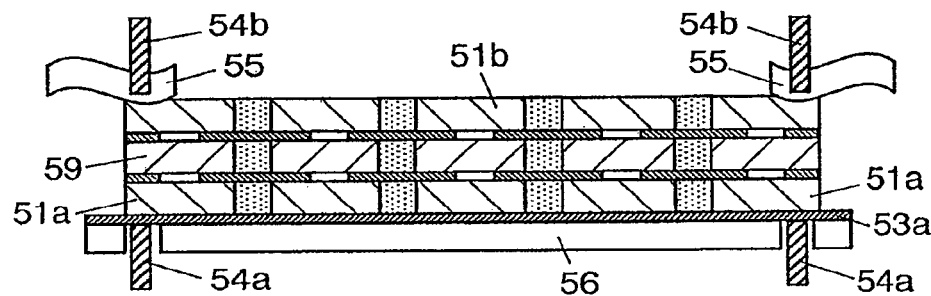
Figure 6C:
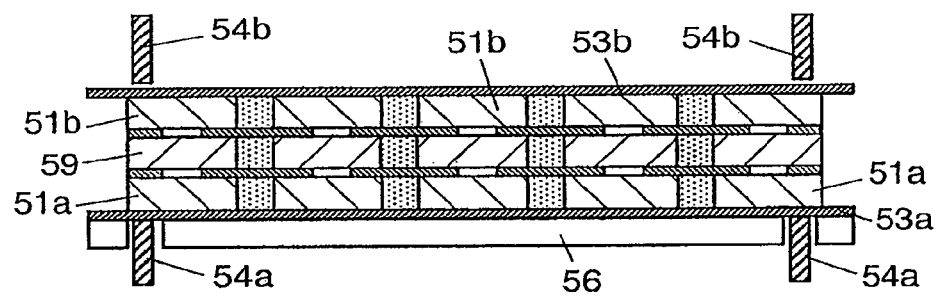
Figure 6D:
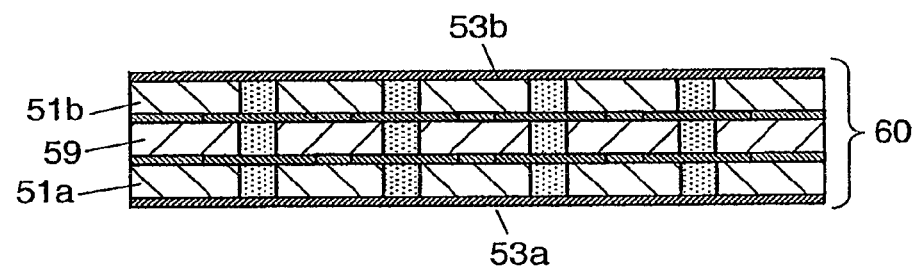
Figure 6E:
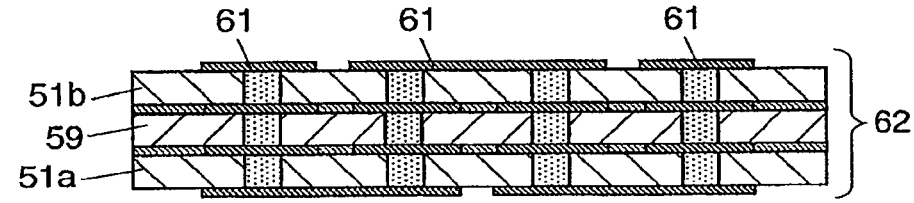
Figure 7:
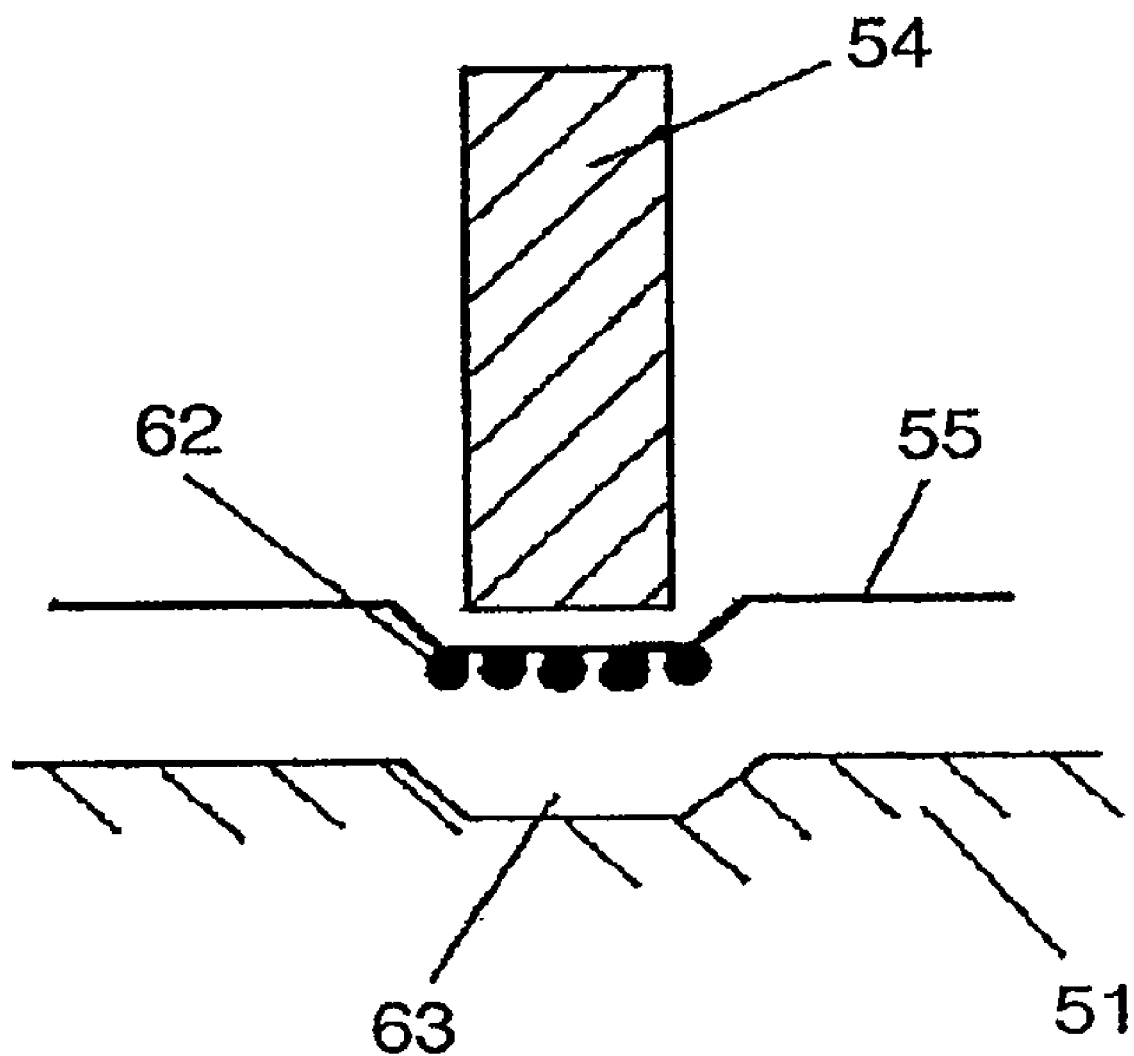
FIG. 7 is a schematic diagram illustrating problems of the conventional manufacturing method of boards.

Then after prepreg 1 cools down to its softening point, supply reel 22 is kept as it is, and take-up reel 23 takes up sheet 5. Sheet 5 is thus taken up only from one side, and at the same time, sheet 5 is peeled off gradually and smoothly from this one side toward another side. Take-up of sheet 5 allows peeling sheet 5 off the solidly pressed section near the supply section as shown in FIG. 4D. FIG. 4E shows that the copper foil and the prepreg have been solidly pressed to each other, and sheet 5 has been peeled off.

INDUSTRIAL APPLICABILITY

The manufacturing method of the boards of the present invention, and the method of manufacturing boards using the mold-releasing sheet and the manufacturing apparatus of the present invention allow keeping a heat temperature not lower than the softening point of the resin impregnated in the prepreg as well as keeping the resin in stage-B status in the following case: Surface of the prepreg is heated and pressed by a heater-punch via the mold-releasing sheet for bonding a copper foil to a core board.

When the sheet is peeled off the surface of prepreg, the sheet is peeled off from its one end sequentially and gradually. This method prevents the resin in the prepreg from attaching to the sheet. This prevention eliminates an exposure of core material of the prepreg from the section solidly pressed when the board is molded, so that etching solution is prevented from soaking into a a circuit pattern when the circuit is formed. As a result, quality of the boards improves, more stable laminating steps can be expected, and the boards are manufactured at a higher productivity.

REFERENCE NUMERALS IN THE DRAWINGS 1, 1a, 1b Prepreg
2 Via
3a, 3b Copper foil
4a, 4b Heater-punch
5 Mold-releasing sheet
6 Positioning stage
7 Two-layer copper clad board
8 Circuit pattern
9 Two-layer board
10 Four-layer copper clad laminated board
11 Circuit pattern
12 Four-layer board
22 Supply reel
23 Take-up reel
24 Pressuring hole
25a, 25b Guide roll

The invention claimed is:

1. A manufacturing apparatus for boards, the boards being formed by laminating metal foil and board material,
the apparatus comprising:
a stage for positioning and laminating a board material thereon;
a pressuring hole provided to the stage;
heat and press means for heating and pressing the board material, the heat and press means being movable up and down and disposed above and under a place of the pressuring hole;
a mold-releasing sheet supply and discharge means movable up and down, the mold-releasing sheet supply and discharge means comprising:
a supply reel for supplying a mold-releasing sheet wound around the supply reel to the stage, the supply reel being disposed at a first end of the stage;
a take-up reel for taking up the mold-releasing sheet from the stage, the take-up reel being disposed at a second end of the stage;
a plurality of guide rollers for guiding the mold-releasing sheet; and
a tension adjuster for adjusting tension applied to the mold-releasing sheet,
wherein the mold-releasing sheet is supplied on the board material and discharged passing the place of the pressuring hole and between the heat and press means disposed above and under the pressuring hole, when the board material is directly heated and pressed by the heat and press means,
wherein the tension adjuster releases a tension between the supply reel and the take-up reel when the heat and press means and the mold-releasing sheet supply and discharge means moves downward, and
wherein after the board material cools down to its softening point, the supply reel is kept as it is, and the take-up reel takes up the mold-releasing sheet from one side.

2. The manufacturing apparatus of claim 1, wherein the guide rollers are disposed between the supply reel and the take-up reel, the guide rollers guide the mold-releasing sheet so that the mold-releasing sheet passes above the place of the pressuring hole and between the heat and press means disposed above and under the place of the pressuring hole.

3. The manufacturing apparatus of claim 1, wherein the pressuring hole has a diameter greater than a diameter of the heat and press means, and the heat and press means move horizontally.

4. The manufacturing apparatus of claim 1, wherein the heat and press means are formed of heater-punches.

5. The manufacturing apparatus of claim 1, wherein the heat and press means are formed of one of a pulse heater and an ultrasonic vibrator.

* * * * *